United States Patent [19]
Kleveland

[11] Patent Number: 5,528,168
[45] Date of Patent: Jun. 18, 1996

[54] POWER SAVING TERMINATED BUS

[75] Inventor: Bendik Kleveland, San Jose, Calif.

[73] Assignee: Intel Corporation, Santa Clara, Calif.

[21] Appl. No.: 412,556

[22] Filed: Mar. 29, 1995

[51] Int. Cl.⁶ .................... H03K 17/16; H03K 19/003
[52] U.S. Cl. .................. 326/30; 326/86; 375/257
[58] Field of Search ...................... 326/30, 86; 375/257

[56] References Cited

U.S. PATENT DOCUMENTS

| | | | |
|---|---|---|---|
| 4,251,742 | 2/1981 | Beelitz | 326/30 |
| 5,023,488 | 6/1991 | Gunning | 326/30 |
| 5,089,723 | 2/1992 | Davis et al. | 326/30 |
| 5,313,105 | 5/1994 | Samela et al. | 326/30 |
| 5,336,948 | 8/1994 | Jordan | 326/30 |
| 5,347,177 | 9/1994 | Lipp | 326/30 |

OTHER PUBLICATIONS

"Regular Brief Papers—A Dynamic Line–Termination Circuit for Multireceiver Nets", Michael Dolle, *IEEE Journal on Solid-State Circuits*, vol. 28, No. 12, Dec. 1993, pp. 1370–1373.

"A 500-Megabyte/s Data-Rate 4.5M DRAM", Kushiyama, et al., *IEEE Journal of Solid-State Circuit*, vol. 28, No. 4, Apr. 1993, pp. 490–498.

"WP 3.7: A CMOS Low-Voltage-Swing Transmission-Line Transceiver", Gunning, et al., 1992 *IEEE International Solid-State Circuits Conference*, pp. 58–59.

*Primary Examiner*—Edward P. Westin
*Assistant Examiner*—Richard Roseen
*Attorney, Agent, or Firm*—Blakely, Sokoloff, Taylor & Zafman

[57] ABSTRACT

A bus termination method and apparatus, specifically, a terminator circuit, a driver/terminator circuit, and appropriate control logic. The terminator circuit and the driver/terminator circuit provide termination of an interface node to one of a first and a second voltage potential selected according to a previous logic value sampled on the input node at a time determined by a clock signal. The driver/terminator circuit also drives data values on the interface node. The terminator circuit and the driver/terminator circuit can be used in bus agents in a computer system. In one computer system configuration, a driving bus agent drives a signal line which is terminated by a predetermined terminating bus agent. Each bus agent compares its device identification to a bus master identification to determine whether to drive, terminate, or tristate the bus.

36 Claims, 5 Drawing Sheets

POWER SAVING TERMINATED BUS

FIELD OF THE INVENTION

The present invention pertains to the field of information transmission between computer system components and specifically, circuits and methods for driving and terminating signal lines.

BACKGROUND

In a typical computer system, numerous signal lines are used to connect integrated circuits. Information is transmitted from a driver to a receiver over these signal lines through different signal levels, with the ability to switch from one signal level to another often being the factor limiting the maximum rate of information transmission. The ability to switch a signal line is not only affected by the characteristics of the driver that is causing the transition, but also by the characteristics of the signal line, the other devices attached to the signal line, and the termination, if any, of the signal line. One important characteristic of drivers, signal lines, and terminations is their impedance.

At least one integrated circuit coupled to a signal line typically has an output buffer for driving the signal line. As technology progresses, these output buffers are able to drive signals having faster transitions. The higher frequency components inherent in the faster transitions are well known to increase various transmission line effects including ringing and wave reflection. These transmission line effects increase as signal frequency increases due to the frequency dependence of signal line impedance. Thus, increasing measures are required to compensate for transmission line effects as signal frequencies are driven higher.

To adequately accommodate high frequency signals, many prior art signaling schemes drive a signal line terminated in a very high impedance input buffer with an output buffer having a driving impedance substantially matched to the characteristic impedance of the signal line. The matching of the driving impedance of the output buffer to the signal line allows the most power transfer from the output buffer to the signal line. Due to the very high impedance of the input buffer, the signal line may be considered to have an "open" termination.

In this signaling scheme, a high signal level (Vcc) and a low signal level (Vss) are used, the low signal level typically being ground (zero volts). A low to high transition generated by an output buffer of a driver device propagates down the signal line as an incident voltage wave until it reaches the end of the signal line after a propagation delay, T. Since the output buffer and the signal line are designed to have approximately the same impedance, the voltage which initially propagates down the signal line is one half the Vcc voltage level. Due to the mismatch between the line impedance and the high impedance at the line end, a reflected wave occurs which propagates back to the output buffer after a total propagation delay of 2T. It is this reflected wave which brings the line to Vcc. Thus, a receiver at the end of the signal line receives a voltage of Vcc after a delay of T, but a receiver near the output buffer does not receive the full Vcc voltage until a delay of approximately 2T. This type of signaling scheme is known as reflected wave switching and has the disadvantage that it requires a time period of twice the propagation delay of the signal line to insure that all receivers have received the appropriate voltage level.

By using incident wave switching, the time required for the entire signal line to attain its final value can be reduced by a factor of two. Incident wave switching can be accomplished in a system with "open" ended signal lines by using a very low impedance output buffer. In such a system, the impedance of the output buffer of the driver device is selected to be much lower than the characteristic impedance of the signal line. When the output buffer switches, an incident voltage wave of practically the full magnitude of the voltage swing between Vcc and Vss is driven on the signal line, allowing receivers to switch upon receiving the incident wave. The reflections which will result from the "open" termination can be limited by clamping circuits included on devices coupled to the signal line; however, these reflections may still result in malfunction due to the overdriving of some devices. Also, an initial reflection from the high impedance end of the signal line may be again reflected by the driver, resulting in multiple reflections with the possibility of causing receivers to sample improper signal levels. Finally, as switching frequencies and edge rates increase, reflections and other transmission line effects in a system with "open" ended signal lines tend to worsen.

Due to the problems posed by reflections on signal lines with "open" terminations, a variety of signal line terminations have been used. One common signaling scheme terminates a signal line to a fixed potential with a termination resistor having the same impedance as the characteristic impedance of the signal line. The signal lines may be terminated to Vcc, ground, or an intermediate potential through the terminating resistor. Using these matched terminations prevents the incident wave from being reflected, thus allowing the receivers to properly sample the signal line upon receiving the incident wave (i.e. incident wave switching). Assuming that the termination resistor is connected to Vcc, a high logic level will appear on the signal line as Vcc, and a low logic level will appear on the signal line as ½ Vcc. While the voltage swing is reduced as compared to the "open" termination case, the dramatic reduction in reflections and the ability to utilize incident wave switching make resistively terminated signal lines a practical solution for some applications.

The resistively terminated signal lines discussed above have the disadvantage of increasing power consumption. With the resistive termination to Vcc, driving a signal line to ground will result in a continuous current from the output buffer through the resistor in order to maintain the signal level at ½ Vcc. Considering the increasing importance of power savings in computer systems the increased power consumption of a typical resistive termination scheme is a significant disadvantage.

FIG. 1 illustrates a prior art signaling scheme which may reduce some of the problems with resistively terminated signal lines. This scheme is also addressed in "A Dynamic Line-Termination Circuit for Multireceiver Nets", IEEE Journal on Solid-State Circuits, Vol. 28, No. 12, December 1993. Here the driver and receiver combination immediately terminates a line to signal values as they are received. Driving device 100 includes an output buffer 120 which drives a transition on signal line 130. The output buffer 120 is configured with a lower impedance than the signal line 130 such that an incident voltage wave produced by output buffer 120 on signal line 130 crosses the threshold voltage of input buffer 150 of receiver 110. This scheme utilizes an active termination device formed by P transistor 140 and N transistor 160 which is matched to the signal line impedance. The active termination device turns on during the switching of the signal line 130 when the incident voltage wave causes input buffer 150 to switch. Since the termination device terminates the signal line to the signal value being driven, there is not continuous additional power consumption due to the termination; however, the switching of P transistor 140 or N transistor 160 during the incident voltage wave from output buffer 120 can produce a step voltage on signal line 130.

In a typical application, many receivers such as receiver 110 are used on signal line 130, and each termination will contribute to signal line noise with its step voltage, resulting in the incident voltage wave being altered by each of the terminating receivers. These noise causing step voltages occur at different times since the receivers are generally located at different distances from the output buffer. Additionally, once all of the receivers have switched and are terminating the signal line to its present value, the next time a driver tries to drive the opposite value on the signal line, it will have to overcome all of the terminating receivers. This may result in poor performance in a system with many receivers. Further, since the driving circuit is not tuned to the impedance of the line, any noise propagating back to the driver will be reflected rather than absorbed. Thus the signaling scheme shown in FIG. 1 addresses the power consumption disadvantage of resistively terminated signal lines, but has some shortcomings of its own.

SUMMARY OF THE DISCLOSURE

The present disclosure describes a terminator circuit providing termination of an input node to one of a first and a second voltage potential. The terminator circuit includes a delay element coupled to receive a first input value of the input node during a first clock cycle of a clock signal. The delay element has a delay element output of either of a high or a low logic value which is representative of the first input value delayed a first period according to the clock signal. The delay element may be a latch clocked by the clock signal. The terminator circuit also includes a first and a second termination device, the first termination device selectably coupling the first voltage potential to the input node if the delay element output is the high logic value, and the second termination device selectably coupling the second voltage potential to the input node if the storage device output is the low logic value. Thus, the terminator circuit terminates the input node according to a previous value of the input node.

The present disclosure also describes a driver/terminator circuit used in an integrated circuit including a first voltage potential, a second voltage potential, an enable line with an enable signal, a data line with a data signal, and a clock signal having a first clock cycle and a second clock cycle subsequent to the first clock cycle. The driver/terminator circuit has an interface node having a first input value during the first clock cycle and a terminate line with an associated terminate signal. A storage device is coupled to the interface node and samples the first input value at a sampling time determined by the clock signal. The storage device supplies the first logic value on a storage device output during the second clock cycle. Control logic coupled to the storage device output has a control output indicating the data signal from the data line if the terminate signal is inactive and indicating the storage device output if the terminate signal is active. The driver/terminator circuit further includes a first and a second termination device, the first termination device selectably coupling the first voltage potential to the input node if the control output is a high logic value, and the second termination device selectably coupling the second voltage potential to the input node if the control output is a low logic value.

The terminator circuit and the driver/terminator circuit are capable of receiving input signals and are suitable for use in bus agents of a computer system as input buffers and input/output buffers. In a computer system with a plurality of bus agents, each bus agent may have a bus master identification register and a device identification register, the bus agent driving or terminating a signal line according to a comparison of the bus master identification register and the device identification register.

BRIEF DESCRIPTION OF THE FIGURES

The present invention is illustrated by way of example and not limitation in the figures of the accompanying drawings.

DETAILED DESCRIPTION

A power saving terminated bus is described. In the following description, numerous specific details are set forth, such as device technologies, particular logic gates, and signaling nomenclature, in order to provide a thorough understanding of an embodiment of the present invention. For example, specific logic gates are used to implement a particular logical operation which could be accomplished by any of a variety of logical combinations. Further, voltage levels of a power supply voltage (Vcc) and ground (Vss) are used to represent a logical 1 (high) and 0 (low). It will be apparent to those skilled in the art that the present invention may be practiced without these specific details.

Overview of the Present Invention

The present disclosure describes a terminator circuit for terminating a signal line on a bus to one of either a first or a second voltage potential. This terminator circuit uses a previous logic value to determine which voltage potential terminates the signal line. The previous logic value is sampled from the signal line at a time determined according to a clock signal. The sampling can be accomplished using a latch which samples the signal line at the rising edge of the clock signal, the latch having an output indicating the previous logic value. Thus a logic level on the signal line sampled at a time determined by the clock signal in a first clock cycle controls the termination of the signal line in a second clock cycle subsequent to the first clock cycle.

The present disclosure also describes a driver/terminator circuit which not only can terminate the signal line according to the above technique, but also can drive the signal line according to a logic value on a data line. The terminator circuit and the driver/terminator circuit can be used in bus agents of a computer system. In one computer system, each driving bus agent drives a signal line which is terminated by a predetermined terminating bus agent. Each bus agent compares its device identification to a bus master identification to determine whether to drive, terminate, or release the bus. The use of designated driving and terminating bus agents can be particularly useful in a computer system with a terminated ring bus configuration.

Figure 1:
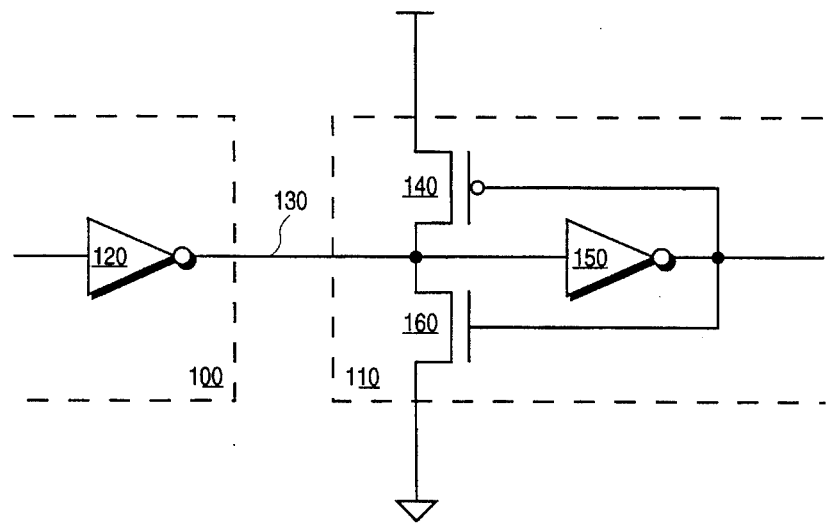
FIG. 1 is a schematic representation of a prior art bus termination circuit.

One advantage of present invention when compared to the system of FIG. 1 is the reduction in system noise. The present terminator circuit does not change the termination voltage during the time in which a transition is occurring on the signal line, thus preventing the addition of noise during the signal transition. Further, both the driver circuits and the termination circuits are matched to the line impedance and serve to terminate any reflections incident to these driver circuits. Another advantage is that the use of a single matched termination does not adversely affect driver performance as might the use of many switching termination devices. Finally, the present system also provides power savings when a correlated sequence of logical values occur in the system.

Figure 2:
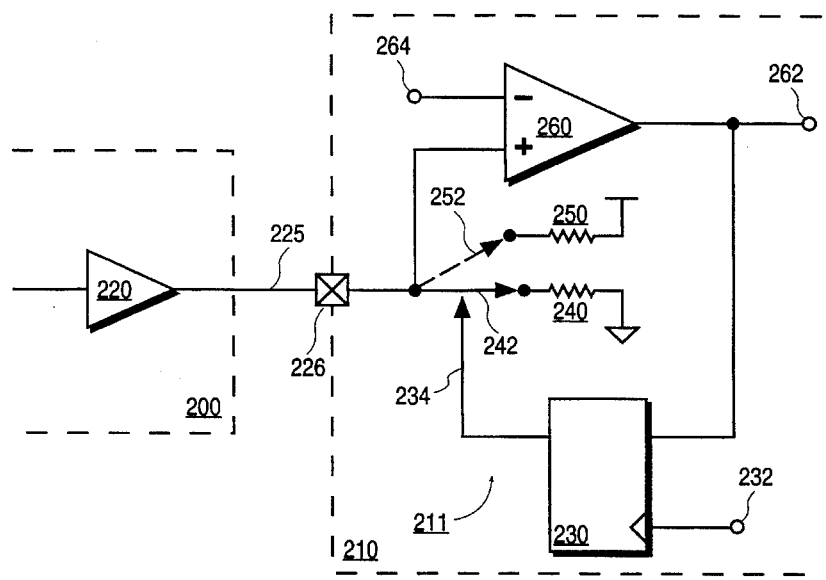
FIG. 2 is a schematic representation including a terminator circuit of the present invention.

Embodiment of FIG. 2

In the embodiment of the present invention shown in FIG. 2, bus agent 210 includes terminator circuit 211 with an input node 226 coupled to signal line 225. The terminator circuit 211 selectively couples signal line 225 through input node 226 to a first or a second voltage potential according to a last value of signal line 225 stored in latch 230. In this case the first voltage potential is Vcc which is provided on a first power supply line, and the second voltage potential is Vss which is provided on a second power supply line.

Terminator circuit 211 includes differential amplifier 260 with an output coupled to node 262, a negative input terminal coupled to a positive voltage on bias input line 264 and a positive input coupled to input node 226. A storage device, latch 230 has an output coupled to control line 234, an input coupled to node 262, and a clock input coupled to clock line 232. Latch 230 is a master slave latch and samples its input at a time determined by a periodic signal. As will be seen, this latch is used to provide a timed delay. Clock line 232 carries the periodic signal enabling the capture of a valid logic level on node 262 reflective of the logic level on signal line 225. The periodic signal will typically be of the same frequency as a bus clock signal (although it may be skewed with respect to the bus clock signal) such that a value of signal line 225 is captured during each bus clock cycle of the bus clock signal for the use during the next bus clock cycle. Thus latch 230 samples its input at a time determined by the periodic signal, in this case, the rising edge of the clock signal. Switch 252 selectively couples input node 226 to Vcc through resistance 250 or input node 226 to Vss through resistance 240 according to the control line 234. Switch 252 may comprise one or two individual switches. In the case of one switch, this switch may selectively couple resistance 240 or resistance 250 to input node 226. In the case of two switches, each switch alternately enables a resistive path to either Vcc or Vss.

The operation of terminator circuit 211 may be better understood considering a sequence of logical values on signal line 225. Driver circuit 220 of bus agent 200 is a typical driver circuit which drives a logical 1 value by driving the Vcc voltage level on signal line 225 and drives a logical 0 by driving the Vss voltage level on signal line 225. Assume that driver circuit 220 first drives a logical 1 on signal line 225. Differential amplifier 260 receives the logical 1 through input node 226. An initial bias voltage is selected for bias line 264 such that node 262 indicates the logical value of signal line 225. The logical 1 value on node 262 is latched by latch 230 at the rising edge of the periodic signal on clock line 232. The control line 234 now indicates the logical 1 and thereby causes switch 252 to couple input node 226 to Vcc through resistance 250. As the next bus clock cycle begins, assume again that driver circuit 220 of bus agent 200 drives a logical 1 value on signal line 225. Again, this logic value propagates through differential amplifier 260 with a proper bias voltage on bias line 264 and is latched by latch 230 upon the next rising edge of the periodic signal on clock line 232. Since latch 230 was already storing a logical 1, there is no change to control line 234 and switch 252 continues to couple input node 226 to Vcc.

Now that a first logical 1 value has propagated to control line 234 and switch 252 has coupled input node 226 such that it is terminated to Vcc, there is negligible static power dissipation due to the termination of signal line 225. For subsequent logical 1 values driven on signal line 225 before a logical 0 signal is driven, the advantage of negligible static power dissipation due to the line termination will continue because the line will continue to be terminated to Vcc which is the voltage driver circuit 220 is driving on signal line 225.

When driver circuit 220 does drive a logical 0 value on signal line 225, differential amplifier 260 will drive this value to node 262. At this time, driver circuit 220 will be driving a logical 0 value on signal line 225 and switch 252 will be coupling input node 226 to Vcc through resistance 250, thus dissipating power. Upon the next clock edge of the periodic signal on clock line 232, latch 230 will latch the logical 0 value on node 262. Control line 234 will then cause switch 252 to couple input node 226 to Vss through resistance 240. Unlike the prior art of FIG. 1, the termination of the present invention does not switch during the input transition and does not add noise which could increase the time required for signals to stabilize on the signal line. If, during the next bus clock cycle, driver circuit 220 drives another logical 0 value on signal line 225, the termination to Vss will not cause significant static power dissipation because driver circuit 220 is driving signal line 225 to Vss. As can be readily understood from the foregoing description, terminator circuit 211 saves the most power when logic values are repeated on signal line 225.

In addition to the power saving advantage, terminator circuit 211 allows incident wave switching to be used because the termination effectively eliminates reflected voltage waves. This is advantageous as described in the background section because the maximum time required for a signal to reach any bus agent coupled to signal line 225 will be the total propagation delay of signal line 225.

Computer System Employing the Present Invention

Figure 3:
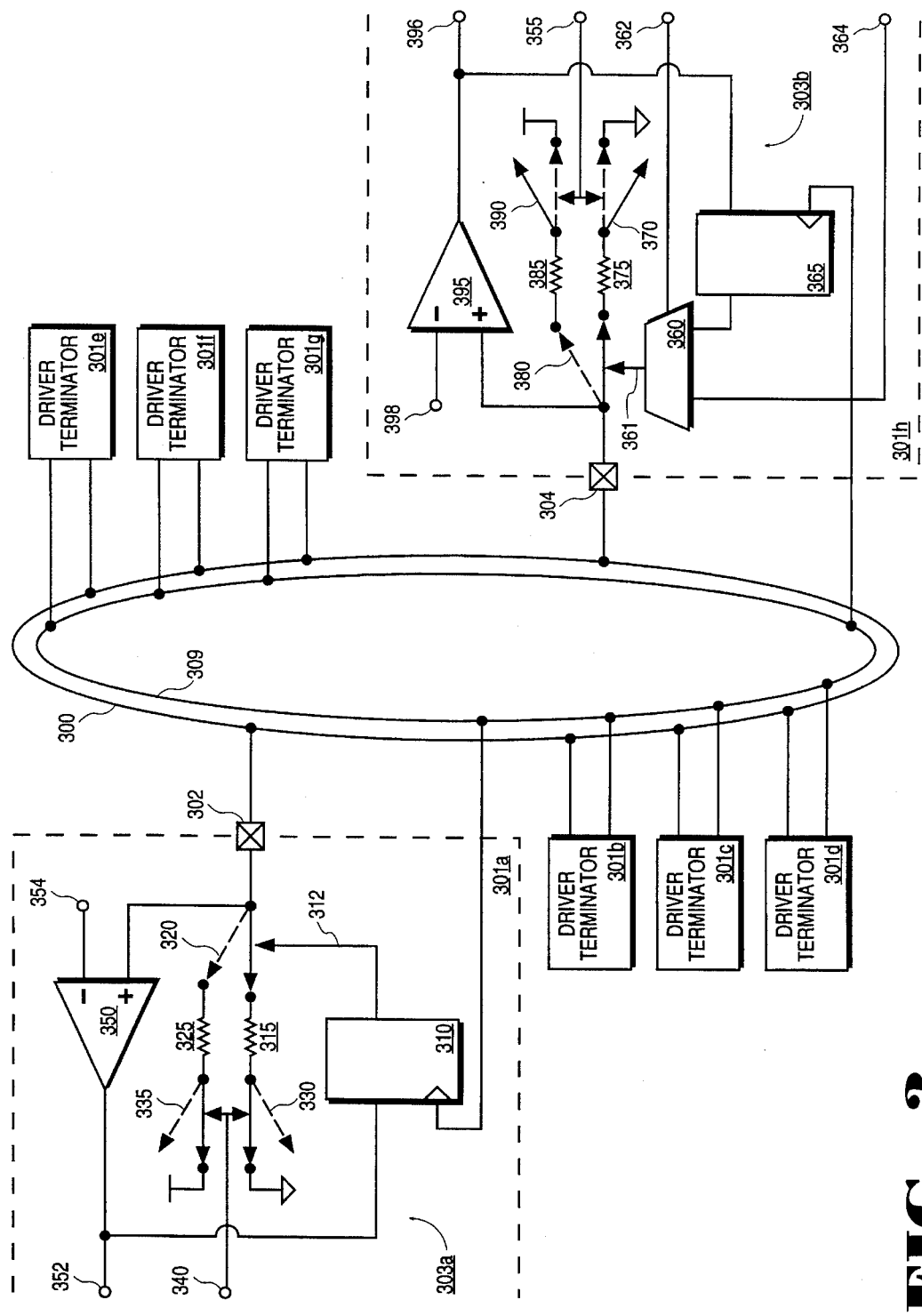
FIG. 3 is a schematic representation of a computer system including a bus agent utilizing a terminator circuit of the present invention and a bus agent utilizing a driver/terminator circuit of the present invention.

In FIG. 3, a computer system of the present invention is illustrated. The computer system includes bus agents 301a, 301b, 301c, 301d, 301e, 301f, 301g, and 301h, each being coupled to bus 300. Bus agent 301a has a terminator circuit 303a, and bus agent 301h has a driver/terminator circuit 303b. Driver/terminator circuit 303b is coupled through bus connection 304 to bus 300 which is then coupled to terminator circuit 303a through input node 302. Through bus 300, terminator circuit 303a may thus receive signals driven by driver/terminator circuit 303b. Terminator circuit 303a is similar to terminator circuit 211 of FIG. 2 but also includes enable line 340 such that terminator circuit 303a may be enabled to terminate when driver/terminator circuit 303b drives and disabled when driver/terminator circuit 303b does not drive. In other words, terminator circuit 303a and terminator/driver circuit 303b are suitable for use as input buffers and input/output buffers on a bidirectional bus.

Terminator circuit 303a includes differential amplifier 350 with a positive input coupled to input node 302, a negative input coupled to bias input line 354 and an output line coupled to node 352. Latch 310 has an input node coupled to node 352, an output coupled to control line 312 and a clock input. Control line 312 controls switch 320, selectively coupling input 302 to resistance 325 or coupling input node 302 to resistance 315. As was the case with switch 252 of FIG. 2, switch 320 may comprise one or two switching elements. Enable line 340 is coupled to control switch 335 and switch 330. Switch 335 selectively connects Vcc and resistance 325 when an active enable signal is present on the enable line 340. Similarly, switch 330 selectively connects Vss and resistance 315 in response to the active enable signal. Thus, when an active enable signal is present, switch 320 causes the selectable termination of bus 300 to either of Vss through resistance 315 or Vcc through resistance 325 according to control signal 312. When an active enable signal is not present on enable line 340, terminator circuit 303a is effectively tristated and will not be able to terminate bus 300 regardless of the value present on control line 312.

Driver/terminator circuit 303b includes differential amplifier 395 with a negative input terminal coupled to receive a positive voltage on bias input line 398, a positive input coupled to bus connection 304, and an output coupled to node 396. A storage device, latch 365, has an input coupled to node 396, a clock input, and an output. A driver multiplexer 360 has a first driver multiplexer input coupled to the output of latch 365, a second driver multiplexer input coupled to data line 364, a driver multiplexer control input coupled to a terminate line 362, and a driver multiplexer output coupled to control line 361. Switch 380 selectively couples bus connection 304 to resistance 375 or resistance 385 according to control line 361. An enable line 355 is coupled to control switch 390 and switch 370. In the presence of an active enable signal on enable line 355 switch 370 selectively connects Vss and resistance 375, and switch 390 selectively connects Vcc and resistance 385.

Driver/terminator circuit 303b terminates bus 300 when an active enable signal is present on enable line 355 and the terminate line 362 causes driver multiplexer 360 to select the first driver multiplexer input which is coupled to the output of latch 365. In this case, driver/terminator circuit 303b operates similarly to receiver 303a. When the terminate line 362 causes driver multiplexer 360 to select the second driver multiplexer input which is coupled to data line 364, driver/terminator circuit 303b then operates as an output circuit and drives output signals on bus 300 according to a data signal received on data line 364.

The operation of driving and terminating circuits of the various bus agents shown in the computer system of FIG. 3 can be understood by considering the operation of driver/terminator circuit 303b of bus agent 301h and terminator circuit 303a of bus agent 301a. In this computer system, a system clock line (309) provides a system clock signal with a system clock frequency available to bus agents 301a–301h. Latches 310 and 365 are either clocked by the system clock signal or an alternate clock signal with the same frequency as the system clock frequency. In a ring bus structure such as bus 300, it is desirable to have a driving bus agent (bus agent 301h) geometrically opposite the terminating bus agent (bus agent 301a), meaning that a first distance measured following bus 300 counterclockwise from bus agent 301h to bus agent 301a is approximately the same as a second distance measured following bus 300 clockwise from bus agent 301h to bus agent 301a. This facilitates the use of incident wave switching, allowing all receiving bus agents to sample the bus after the time period required for a signal to propagate one-half the total length of the bus.

In a first clock cycle of the system clock signal, assume driver/terminator circuit 303b drives a first signal representative of a logical 0 value on bus 300 responsive to a logical 0 value on data line 364 produced by additional logic contained in bus agent 301h. In order for the value on data line 364 to be driven to bus 300, an active enable signal is present on enable line 355 thereby connecting resistance 385 to Vcc through switch 390 and resistance 375 to Vss through switch 370. Terminate line 362 causes driver multiplexer 360 to select data line 364 as the driver multiplexer output coupled to control line 361, allowing data line 364 to control switch 380. According to the logical 0 value on data line 364, switch 380 will couple bus connection 304 through resistance 375 to Vss, driving the first signal indicative of a logical 0 value on bus 300.

The first signal is received by receiver 303a of bus agent 301a through input node 302. Assuming that latch 310 is initialized to a logical 0 value, control line 312 selects switch 320 to couple input node 302 to resistance 315. An active enable signal on enable line 340 couples resistance 315 to Vss through switch 330, thus input node 302 is terminated to Vss by terminator circuit 303a and driven to Vss by driver/terminator circuit 303b. Differential amplifier 350 drives a logical 0 value on node 352 in response to the first signal received on input node 302. As the logical 0 value on node 352 is the valid logical value of bus 300 during the first clock cycle, latch 310 is clocked to capture the logical 0 value so that it may be used to control the termination of bus 300 during a second clock cycle.

In the second clock cycle, assume data line 364 of bus agent 301h indicates a logical one value. Since an active enable signal is still present on enable line 355 and terminate line 362 still controls driver multiplexer 360 such that control line 361 is indicative of data line 364, switch 380 now couples bus connection 304 to Vcc through resistance 385, thereby driving a second signal indicative of a logical 1 on bus 300. The second signal received by terminator circuit 303a causes differential amplifier 350 to indicate a logical 1 value on node 352. As this logical 1 value is the valid logical value of bus 300 during the second clock cycle, latch 310 is clocked to capture the logical 1 in order to control switch 320 such that bus 300 will be terminated to Vcc through resistance 325 during a next bus cycle. Accordingly, terminator circuit 303a can terminate bus 300 using the last logical value driven on bus 300. If bus agent 301a contained a driver/terminator circuit such as driver/terminator circuit 303b in bus agent 301h, bus agent 301a could then also drive bus 300 and bus agent 301h would then terminate bus 300 in a similar manner as described for bus agent 301a.

In general, in the ring bus computer system of FIG. 3, opposite bus agents will drive and terminate signal lines on bus 300. For example, bus agent 301*b* and 301*g* form an opposite driving and terminating pair as do bus agents 301*c* and 301*f*, bus agents 301*d* and 301*e*, and bus agents 301*a* and 301*h*. When any one particular bus agent is driving bus 300, the other bus agents (except the terminating bus agent) are tristated and may receive a signal driven by the driving bus agent. The bus agent opposite the driving bus agent may also receive the signal, but instead of being tristated, terminates bus 300.

The technique of driving and terminating bus 300 using opposite bus agents facilitates the use of incident wave switching. In the ring bus topology of bus 300 where a signal line has a characteristic impedance of Zo, driver/terminator circuit 303*b* effectively sees two parallel loads leaving the bus connection 304 in opposite directions. Thus, the driver/terminator circuit 303*b* should have a driving impedance of ½ Zo to match the impedance seen on bus 300. Incident waves generated by driver/terminator circuit 303*b* propagate both clockwise and counter-clockwise on bus 300 to terminator circuit 303*a*. If the clockwise and counter-clockwise distances are approximately equal, and the incident waves arrive simultaneously, these incident waves will only see the terminating impedance (½ Zo) of terminator 303*a*. In the case of unequal distances, a first arriving incident wave will see the continuing impedance of the signal line (Zo) in parallel with the terminating impedance (½ Zo), resulting in a reduced magnitude incident wave and wave reflections. Thus, having the opposite bus agents driving and terminating bus 300 is important for minimizing reflections as is important when using incident wave switching.

Absolutely precise distances, however, are not required to successfully utilize a terminated ring bus topology. A settling time for reflections allows some tolerance in the distance matching between driver and receiver while still maintaining most of the benefit of the ring structure. Thus, there is some flexibility in the arrangement of a computer system utilizing a ring bus topology. For example, while the ring bus is generally best suited to four or more bus agents, it is not absolutely restricted to an even number of bus agents, as long as each driving agent is reasonably close to being equidistant (relative to the total bus length) to a terminating agent in both the clockwise and counter-clockwise directions.

The primary advantage of the ring bus system is that the maximum total distance between the two furthest bus agents is generally reduced by the ring geometry. The unique problem that the ring bus creates is that there is no end at which a termination may be permanently placed, thus it becomes necessary to terminate the bus at a location determined by the driver of the bus.

The terminator circuit and the driver/terminator circuit of the present invention may also be used in a computer system which is not configured with a ring bus. Many computer system buses are formed in configurations which do have distinct ends, thus allowing a fixed placement of the terminating agent or agents. For example, an embodiment of the present invention may be utilized with a bus formed in a straight line such as that illustrated by signal line 225 in FIG. 2. Such a bus is suited for termination by a bus agent at each end. Each end bus agent terminates the bus to a previous value so long as that bus agent is not driving the bus. Any bus agents other than the end bus agents which may be on the bus are not required to provide termination.

Similarly, other bus topologies which include two or more ends (such as a point to point topology, a daisy bus topology, or an H tree bus topology) may utilize the present termination technique by appropriately positioning terminating bus agents at the bus ends. Again, each terminating agent will typically be configured to terminate unless it is driving. This will provide the advantages of the power saving termination technique without the use of a ring bus structure.

Control Logic for a Bus Agent in a Ring Bus System

Figure 5:
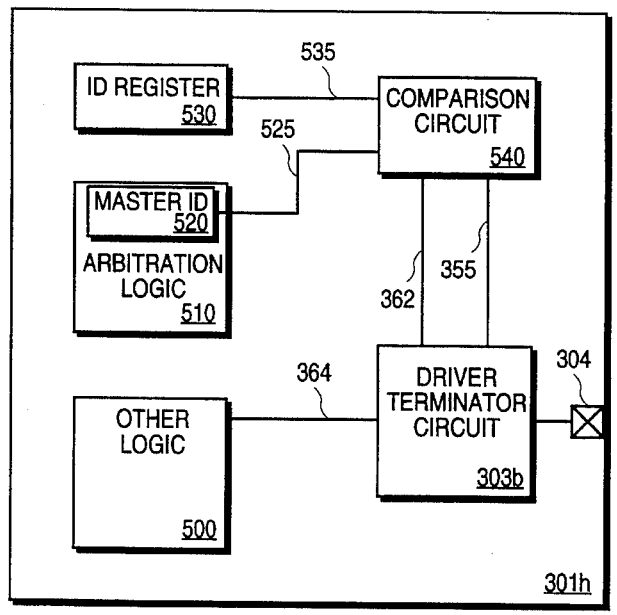
FIG. 5 is a detailed block diagram of the bus agent of FIG. 3 which utilizes a driver/terminator circuit of the present invention.

In order to facilitate driving and terminating by opposite bus agents in a ring bus system, additional logic is needed to generate the control signals on enable line 355 and terminate line 362 of bus agent 301*h* and enable line 340 of bus agent 301*a*. A block diagram of bus agent 301*h* including an embodiment of such additional logic is illustrated in FIG. 5. Driver/terminator circuit 303*b* as previously illustrated in FIG. 3, is coupled by data line 364 to other logic 500 of bus agent 301*h*. The driver/terminator circuit is also coupled to bus connection 304 and coupled by termination line 362 and enable line 355 to a comparison circuit 540. A device identification register indicated by ID register 530 coupled by device identification bits 535 to comparison circuit 540 stores a plurality of bits which form a device identification.

In a computer system such as that in FIG. 3 with eight bus agents, the ID register 530 may comprise three bits. The ID register 530 may be serially shifted in, or otherwise loaded at system start-up. Alternately, ID register 530 may be hard wired to logic values in the computer system, or may comprise non-volatile memory cells which are programmed to store the appropriate device identification. Arbitration logic 510 includes a temporary bus master identification register, master ID 520, coupled by master comparison bits 525 to comparison circuit 540. The bus master identification register stores bits representing which bus agent is temporarily the bus master at a particular time during the operation of the computer system. Arbitration logic 510 receives bus request signals (not shown) from other bus agents and understands the bus protocol of the computer system in which bus agent 301*h* is operating, thereby determining the identification number of the bus agent which is the temporary master or driving bus agent and storing that identification number in the register master ID 520. Preferably, arbitration logic 510 is included in bus agent 301*h*; however, it may be possible to use external arbitration logic by separately transmitting the identification number of the master bus agent.

Figure 6:
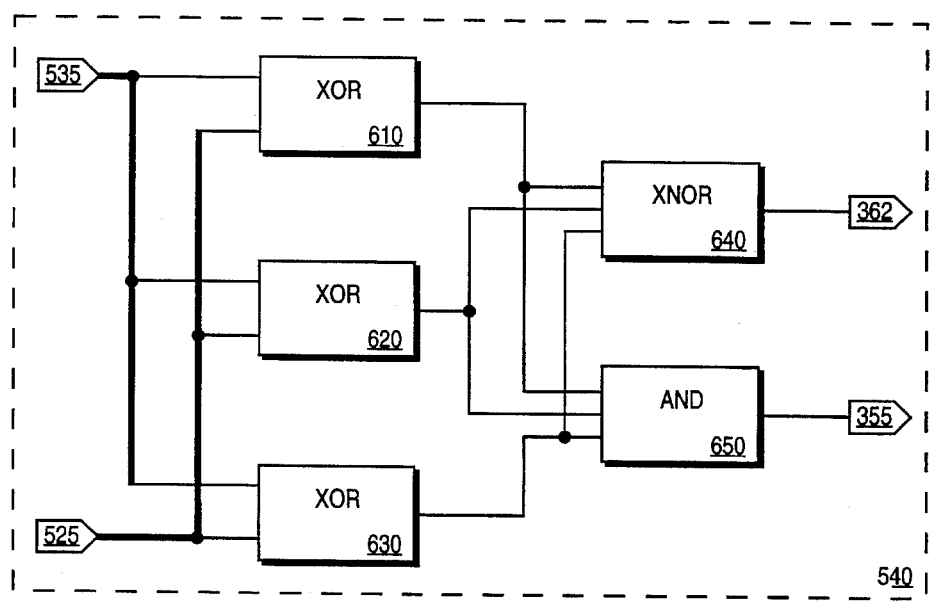
FIG. 6 is a schematic representation of the comparison logic from the block diagram of FIG. 5.

Details of comparison circuit 540 as suited for use with the computer system of FIG. 3 including eight bus agents, is illustrated in FIG. 6. Comparison circuit 540 compares device identification bits 535 to master identification bits 525 using exclusive or gates XOR 610, XOR 620, and XOR 630. If each of the three bits of identification bits 535 are equivalent to the corresponding bits of master identification bits 525 then bus agent 301*h* is temporarily bus master and an active enable signal is generated on enable line 355 by AND gate 650. If each bit of device identification bits 535 has the opposite value of the corresponding bit of master identification bits 525 then bus agent 301*h* is the terminating bus agent and a terminate signal is generated by exclusive NOR gate XNOR 640 on terminate line 362 along with the active enable signal on line 355.

Thus, referring to back to FIG. 3, in order that geometrically opposite bus agents drive and terminate bus 300, appropriate identification numbers need to be selected. For example, bus agent 301*a* could be numbered 000 and bus agent 301h could be numbered 111. When bus agent 301h is the temporary master bus agent on bus 300, the master ID number would be 111. In using the comparison circuit of FIG. 6, an active enable signal would be generated on enable line 355 of bus agent 301h since the device identification bits 535 would equal the master identification bits 525. If bus agent 301a also included bus driving circuitry and became the bus master, the master ID stored in bus agent 301h would then be 000 as determined by arbitration logic 510. The comparison circuit would then generate a terminate signal on terminate line 362 because each bit of the master identification bits 525 would be the opposite value of the corresponding bit of the device identification bits 535 (000 compared to 111). Similarly, other bus agent pairs can be appropriately numbered with bus agent 301b numbered 001 and bus agent 301g numbered 110, bus agent 301c numbered 010 and bus agent 301f numbered 101, and bus agent 301d numbered 011 and bus agent 301e numbered 100. With this or a similar termination control method and apparatus, a computer system can utilize intelligent bus termination. In the computer system of FIG. 3, this termination scheme facilitates the use of incident wave switching.

Figure 4A:
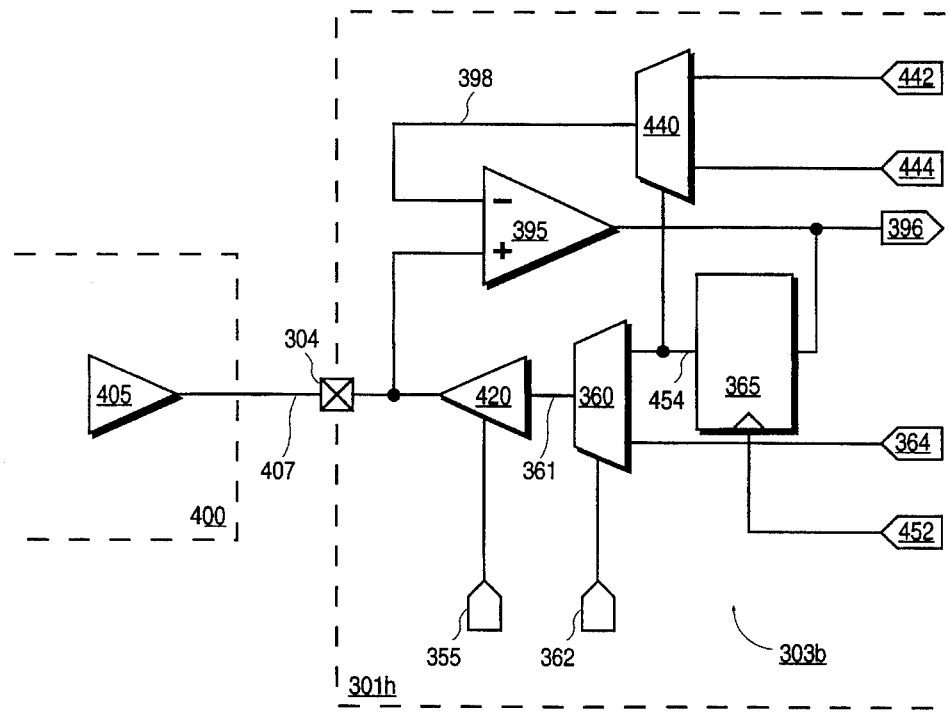
FIG. 4A is a schematic view illustrating details of the driver/terminator circuit of FIG. 3.

Embodiment of FIG. 4A

To promote a better understanding of the present invention, FIG. 4A illustrates an alternate representation of driver/terminator circuit 303b of bus agent 301h. As in FIG. 3, differential amplifier 395 has a positive input coupled to bus connection 304, a negative input coupled to bias input line 398 and an output coupled to node 396 which can provide data to other logic in bus agent 301h. In FIG. 4A a bias multiplexer is also included with a first and second input coupled to bias input 442 and bias input 444, respectively. Latch 365 is a storage device with an input coupled to node 396 and an output coupled to node 454, the latch also having a clock input coupled to bus clock 452. Node 454, the output of latch 365, now also controls bias multiplexer 440. Driver multiplexer 360, which also appeared in FIG. 3, has a first driver multiplexer input coupled to the output of latch 365 now designated node 454 and a second driver multiplexer input coupled to data line 364. The driver multiplexer is still controlled by the terminate line 362 and is coupled to the control line 361.

A driving terminating buffer 420 has an input coupled to control line 361, an enable input coupled to enable line 355 and an output coupled to bus connection 304. Driving terminating buffer 420 can be any of a number of output buffer circuits which can drive a voltage level on bus connection 304 indicative of a logic value on control line 361 and can be tristated when an active enable signal is not present on enable line 355. Many such circuits are well known in the art.

Figure 7:
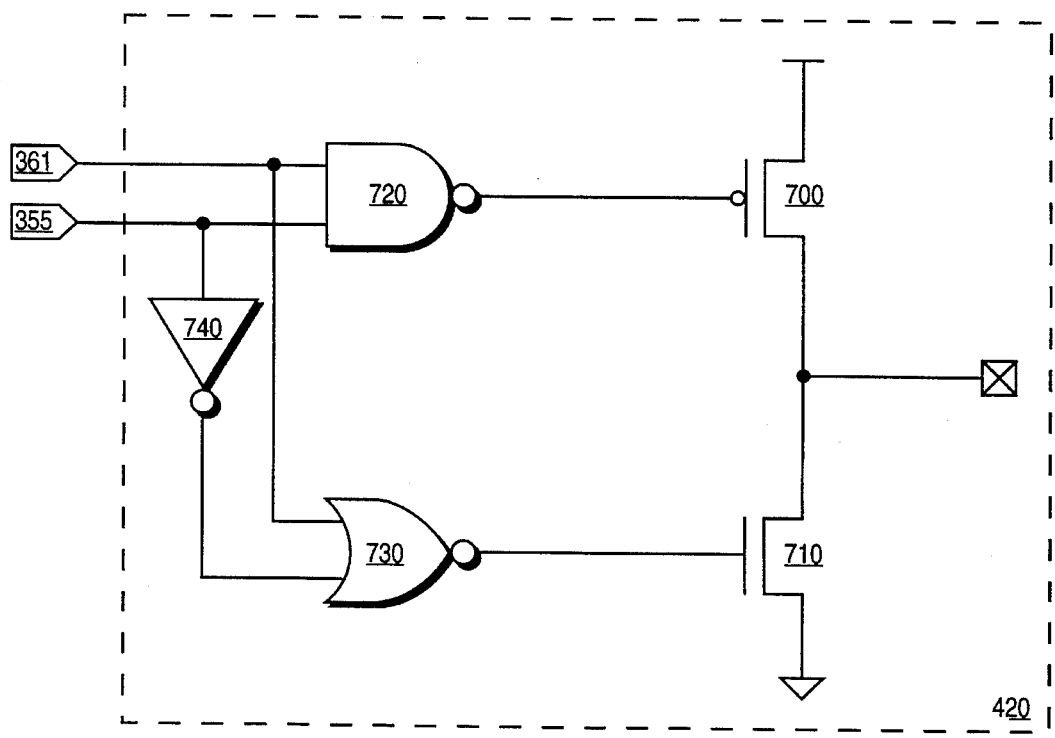
FIG. 7 is a schematic representation of the CMOS driving terminating buffer of the present invention.

One suitable implementation of driving terminating buffer 420 in a CMOS technology is shown in FIG. 7. This particular implementation includes a P transistor 700 with a source coupled to Vcc and a drain coupled to the drain of an N transistor 710 which has a source coupled to ground. The P transistor 700 has a NAND gate 720 with inputs coupled to control line 361 and enable line 355 serving as a pre-driver driving the gate of the P transistor 700. The N transistor has a NOR gate 730 coupled to control line 361 and the output of an inverter 740 coupled to enable line 355 serving as a pre-driver for the gate of the N transistor 710. Driving terminating buffer 420, in fact, performs the same function as the combination in FIG. 3 of switch 370, switch 390, resistance 375, resistance 385 and switch 380. Driving terminating buffer 420 of the present embodiment is configured to have an impedance equivalent to that seen at the bus connection 304 such that it may efficiently transfer power and reduce reflections by driving and terminating the signal line with the same impedance as seen on the signal line.

Power Savings

Figure 4B:
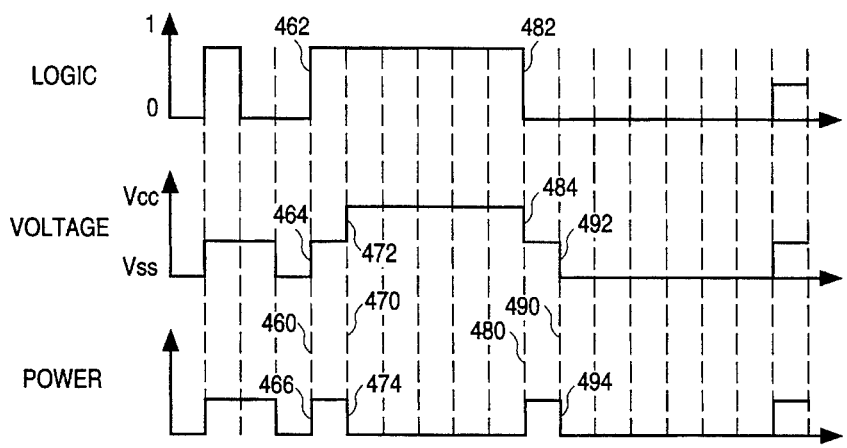
FIG. 4B is a waveform diagram illustrating the operation of the driver/terminator circuit of FIG. 4A.

The power saving aspect of driver/terminator circuit 303b is better illustrated considering the transmission of a sequence of logical values. Driver 405 of bus agent 400 drives this sequence of values on signal line 407, and driver/terminator circuit 303b receives the sequence through bus connection 304. FIG. 4B illustrates the logic values transmitted, the voltage on line 407, and the power dissipated in the bus termination. Vertical dashed lines, such as marker 460, indicate system clock cycle edges. During the clock cycle prior to marker 460, a voltage of Vss was present on signal line 407 indicating a logic value of 0.

At this point, driver/terminator circuit 303b is receiving input signals, therefore no active enable signal is present on enable line 355 and the terminate line 362 is controlling driver multiplexer 360 such that node 454 determines control line 361. Additionally, a logical 0 value has been latched into latch 365 causing driving terminating buffer 420 to terminate bus connection 304 to Vss.

At the time indicated by marker 460, driver 405 switches to driving a logic 1 value as indicated by transition 462. This results in transition 464 to a voltage of ½ Vcc on signal line 407 because driver 405 is now driving signal line 407 to Vcc and driving terminating buffer 420 is still terminating signal line 407 to Vss (Vss is 0 volts). This also results in transition 466 indicating that increased power is now being consumed because there is current flow between driver 405 and driving terminating buffer 420. The voltage level ½ Vcc is now present on the positive terminal of differential amplifier 395 for comparison with the negative terminal of differential amplifier 395 which is coupled to bias input line 398. Bias input line 398 is determined by bias multiplexer 440 which is controlled by the last value of signal line 407 as stored in latch 365 and indicated by a logical 0 on node 454. This couples bias input line 398 to bias input 442 which has a bias voltage value of ¼ Vcc. Thus, when the value of ¼ Vcc on the negative terminal of differential amplifier 395 is compared to the voltage value of ½ of Vcc on input node 304, node 396 is driven to a logical 1 value which is reflective of the logic value which was driven by driver 405.

At the clock edge corresponding the marker 470, the logical 1 value on node 396 is latched by latch 365, resulting in a logical 1 value on node 454. Control line 361 will now also switch to a logical 1 value and driving terminating buffer 420 will terminate signal line 407 to Vcc. Since driver 405 continues driving a logical 1 on signal line 407 after the time indicated by marker 470, and driving terminating buffer 420 is terminating signal line 407 to Vcc, the voltage on signal line 407 switches to Vcc as indicated by transition 472. At this point, there is no path from Vcc to Vss between driver 405 and driving terminating buffer 420 and there is, therefore, a decrease in power consumption due to the termination as shown by transition 474. As long as a logical 1 value continues to be driven by driver 405, there will be virtually no static power consumption due to the termination of signal line 407.

At the time indicated by marker 480, driver 405 begins to drive a logical 0 value on signal line 407 as indicated by transition 482. Transition 484 shows the voltage on signal line 407 switching from Vcc to ½ Vcc with a corresponding increase in power consumption due to the fact that driving terminating buffer 420 is terminating signal line 407 to a different voltage level than driver circuit 405 is driving. The voltage level of ½ Vcc now on bus connection 304 is resolved by differential amplifier 395. Since the last value of signal line 407, a logical 1, is present on node 454, bias multiplexer 440 selects the second bias multiplexer input which is coupled to a bias voltage of ¾ Vcc on bias input 444. Thus, bias input line 398 has a voltage value of ¾ Vcc. Differential amplifier 395 drives a logical 0 on node 396 because the ½ Vcc voltage level on the positive input of differential amplifier 395 is less than the ¾ Vcc voltage level on the negative input of differential amplifier 395. Thus, differential amplifier 395 properly resolves the logical 0 value driven by driver 405 when used in conjunction with bias multiplexer 440 controlled by the last latched logical value. The transition 484 of the voltage on signal line 407 to ½ Vcc is again accompanied by power loss in the termination circuit which does not stop until the time indicated by marker 490 when the logical 0 first driven at the time indicated by marker 480 propagates back to driving terminating buffer 420, causing signal line 407 to be terminated to the same voltage level as driver 405 is driving.

Thus, the present termination scheme only causes additional power consumption when logical values change. In a computer system where certain signal lines, such as address lines, have highly correlated sequences of logical values, substantially less power consumption will result due to the use of this power saving bus termination scheme than would due to a prior art bus termination scheme resistively terminating bus signal lines to a power supply.

What is claimed is:

1. In an integrated circuit including a first voltage potential, a second voltage potential, and a clock line with a clock signal, a terminator circuit with an input node comprising:

a delay element coupled to receive a first input value of the input node during a first clock cycle of the clock signal, the delay element having a delay element output of either a high logic value or a low logic value, the delay element output being representative of the first input value delayed a first period according to the clock signal;

a first termination device selectably coupling the input node to the first voltage potential if the delay element output is the high logic value; and a second termination device selectably coupling the input node to the second voltage potential if the delay element output is the low logic value.

2. The terminator circuit of claim 1 wherein the first period is bounded by the first clock cycle of the clock signal.

3. The terminator circuit of claim 1 wherein the delay element is a latch with a latch input coupled to receive the first input value, a latch output forming the delay element output, and a clock input coupled to the clock line, the latch sampling the first input value at a time determined by the clock signal and indicating the first input value on the latch output during a second clock cycle subsequent to the first clock cycle.

4. The terminator circuit of claim 3 wherein the first voltage potential is provided by a first voltage supply line and the second voltage potential is supplied by a second voltage supply line.

5. The terminator circuit of claim 4 further comprising:

a control line coupled to receive the latch output; and a selector coupled to select either of the first termination device to couple the input node to the first power supply line and the second termination device to couple the input node to the second power supply line according to the latch output on the control line.

6. The terminator circuit of claim 4 further comprising a control line coupled to receive the latch output wherein the first termination device selectably couples the input node to the first power supply line when enabled according to the control line, and the second termination device selectably couples the input node to the second power supply line when enabled according to the control line.

7. The terminator circuit of claim 6 wherein the first termination device is a first transistor enabled by the low logic value on the control line, and the second termination device is a second transistor enabled by the high logic value on the control line.

8. The terminator circuit of claim 3 further comprising a first predriver circuit coupled to an enable line and the latch output, and a second predriver circuit coupled to the enable line and the latch output, wherein the first predriver enables the first termination device to couple the input node to the first voltage potential if the latch output is the high logic value and an active enable signal is present on an enable line, and the second predriver enables the second termination device to couple the input node to the second voltage potential if the latch output is the low logic value and the active enable signal is present on the enable line.

9. The terminator circuit of claim 1 further comprising a comparison circuit controllingly coupled to the first and second termination device, coupled to a device identification register containing a device identification value and coupled to a temporary bus master identification register containing a temporary bus master identification value, the comparison circuit enabling the first and second termination devices if the temporary bus master identification value has a predetermined relationship to the device identification value.

10. The terminator circuit of claim 4 further comprising a differential amplifier with a positive input coupled to the input node, a negative input coupled to an input bias line, the input bias line selectably providing either of a first and a second bias voltage level according to the latch output.

11. The terminator circuit of claim 10 wherein the first power supply line is a Vcc line, the second power supply line is a ground line, the first bias voltage level is approximately one fourth Vcc and the second bias voltage level is approximately three fourths Vcc.

12. In an integrated circuit including a first voltage potential, a second voltage potential, and a clock line with a clock signal, a terminator circuit with an input node having a first logic value of either a high logic value or a low logic value during a first clock cycle of the clock signal, comprising:

a storage device coupled to the clock line and coupled to receive the first logic value of the input node, the storage device sampling the first logic value of the input node at a sampling time determined by the clock signal and supplying the first logic value on a storage device output during a second clock cycle subsequent to the first clock cycle;

a first termination device selectably coupling the input node to the first voltage potential during the second clock cycle if the storage device output is the high logic value; and a second termination device selectably coupling the input node to the second voltage potential during the second clock cycle if the storage device output is the low logic value.

13. In an integrated circuit including a first voltage potential, a second voltage potential, an enable line with an enable signal, a data line with a data signal, and a clock line with a clock signal, a driver/terminator circuit with an interface node having a first input value of either a high logic value or a low logic value during a first clock cycle of the clock signal, comprising:

a terminate line with a terminate signal;

a storage device coupled to the clock line and coupled to receive the first input value of the interface node, the storage device sampling the first logic value of the interface node at a sampling time determined by the clock signal and supplying the first logic value on a storage device output during a second clock cycle subsequent to the first clock cycle;

control logic coupled to the storage device output, the data line, and the terminate line driving a control logic output indicating the storage device output if the terminate signal is active and indicating the data signal if the terminate signal is not active;

a first driving terminating device coupled to receive the enable signal, the first driving terminating device selectably coupling the first voltage potential to the interface node according to the control logic output if the enable signal is active; and a second driving terminating device coupled to receive the enable signal, the second driving terminating device selectably coupling the second voltage potential to the interface node according to the control logic output if the enable signal is active.

14. The driver/terminator circuit of claim 13 wherein the control logic comprises a control multiplexer with a first control multiplexer input coupled to the storage device output, a second control multiplexer input coupled to the data line, a control multiplexer control input coupled to the terminate line, and a control multiplexer output being the control logic output.

15. The driver/terminator circuit of claim 14 wherein the first voltage potential is Vcc, the second voltage potential is Vss, and the first and second driving terminating devices are transistors.

16. The driver/terminator circuit of claim 14 further comprising a differential amplifier with a positive input coupled to the interface node, a negative input coupled to an input bias line, the input bias line selectably providing either of a first and a second bias voltage level according to the storage device output.

17. The driver/terminator circuit of claim 13 further comprising a comparison circuit coupled to a device identification register containing a device identification value and coupled to a temporary bus master identification register containing a temporary bus master identification value, the comparison circuit generating an active enable signal on the enable line if the temporary bus master identification value indicates the device identification value, and the comparison circuit alternately generating an active terminate signal on the terminate line and an active enable signal on the enable line if the temporary bus master identification value has a predetermined relationship to the device identification value.

18. A terminating circuit with a clock line having a clock signal, the terminating circuit coupled to a signal line, receiving a first signal level on the signal line during a first clock period of the clock signal and receiving a second signal level on the signal line during a second clock period subsequent to the first clock period, comprising:

means for sampling the first signal level coupled to the clock line and coupled to receive the signal level and sampling the first signal level at a time determined by the clock signal, the means for sampling having a first output indicating the first signal level during the second clock period;

means for terminating coupled to the first output of the means for sampling, terminating the signal line during the second clock cycle to either of a first and second termination voltage according to the first signal level.

19. The terminating circuit of claim 18 wherein the means for terminating includes a high termination means and a low termination means, the means for terminating activating the high termination means during the second clock cycle if the first signal level is a high logic level and the means for terminating activating the low termination means during the second clock cycle if the first signal level is a low logic level.

20. A terminating circuit including a clock signal on a clock line with a first clock cycle and a second subsequent clock cycle, comprising:

a bus connection;

an enable line;

a comparator having a comparator output line, a positive input coupled to the bus connection, and a negative input coupled to a selected bias line;

a latch coupled to the comparator output line and coupled to the clock line, the latch containing a first signal level sampled at a time determined by the clock signal from the bus connection during the first clock cycle and indicating the first signal level on a latch output during the second clock cycle;

a bias multiplexer having a bias multiplexer control coupled to the latch output, a bias multiplexer output coupled to the selected bias line, and a first and a second bias multiplexer input coupled to a first and a second bias voltage line;

a driving terminating buffer with a buffer input coupled to receive the latch output, a buffer enable coupled to the enable line, and a buffer output coupled to the bus connection.

21. The terminating circuit of claim 20 further comprising:

a terminate line;

a data line;

a driver multiplexer with a driver multiplexer output coupled to the buffer input, a driver multiplexer control coupled to the terminate line, a first driver multiplexer input coupled to the data line, and a second driver multiplexer input coupled to the latch output.

22. The terminating circuit of claim 21 further comprising a comparison circuit coupled to a device identification register containing a device identification value and coupled to a temporary bus master identification register containing a temporary bus master identification value, the comparison circuit generating an active enable signal on the enable line if the temporary bus master identification value indicates the device identification value, and the comparison circuit alternately generating an active terminate signal on the terminate line and an active enable signal on the enable line if the temporary bus master identification value has a predetermined relationship to the device identification value.

23. A computer system with a bus including a signal line and a system clock having a first clock cycle and a second clock cycle subsequent to the first clock cycle, comprising:

a driving bus agent coupled to the bus capable of driving a high or a low signal level on the signal line, the driving bus agent driving a first signal level on the signal line during the first clock cycle and driving a second signal level during the second clock cycle;

a terminating bus agent coupled to the bus including a terminating driver capable of terminating the signal line to the high or the low signal level, an input buffer circuit receiving the first input value from the signal line during the first clock cycle, a latch coupled to the input buffer sampling the first input value at a time determined from the system clock signal, and control logic coupled to the latch and the terminating driver enabling the driver to terminate the signal line to either of the high and the low signal level during the second clock cycle according to the first input value.

24. The computer system of claim 23 wherein the terminating bus agent includes a first comparison circuit coupled to the control logic and coupled to compare a temporary bus master identification value and a first device identification value of the terminating bus agent, the comparison circuit indicating to the control logic that the temporary bus master identification value has a predetermined relationship to the first device identification value.

25. The computer system of claim 24 wherein the driving bus agent includes a second comparison circuit coupled to the control logic and coupled to compare the temporary bus master identification value and a second device identification value of the driving bus agent, the comparison circuit indicating to the control logic that the temporary bus master identification value corresponds to the device identification value.

26. The computer system of claim 23 wherein the signal line has a characteristic impedance which is approximately equal to a driving impedance of the driving bus agent and a terminating impedance of the terminating bus agent.

27. The computer system of claim 26 wherein the signal line has one of a first, second, and third voltage level, the first voltage level representing a logical 0, the third voltage level representing a logical 1, and the second voltage level representing either of a logical 0 and a logical 1, depending on a previous voltage level.

28. The computer system of claim 27 wherein the second voltage level represents a logical 1 if the previous voltage level was a logical 0, and the second voltage level represents a logical 0 if the previous voltage level was a logical 1.

29. A computer system including a bus with a signal line, comprising:

a driving bus agent including:
a first device identification register which contains a first device identification value;
a first master identification register which contains a temporary master identification value;
a first comparison circuit coupled to receive the first device identification value and the temporary master identification value, the first comparison circuit having a first comparison output coupled to a first control bus, the first comparison output indicating that the first device identification value corresponds to the temporary master identification value;
an output circuit coupled to the control bus, coupled to a first data line, and coupled to the signal line, the output circuit being enabled by the first comparison output and driving the signal line according to a first data value on the data line; and a terminating bus agent including:
a second device identification register which contains a second device identification value not equal to the first device identification value, the second identification value having a predetermined relationship to the first identification value;
a second master identification register which contains the temporary master identification value;

a second comparison circuit coupled to receive the second device identification value and the temporary master identification value, the second comparison circuit having a second comparison output coupled to a second control bus, the second comparison output indicating that the second device identification value has the predetermined relationship to the temporary master identification value; and
a termination circuit coupled to the control bus and the signal line, the termination circuit enabled to terminate the signal line by the second comparison output.

30. The computer system of claim 29 further including a clock line with a clock signal wherein the terminating bus agent is coupled to receive the clock signal and further includes a storage device which samples a present value of the signal line at a time determined by the clock signal and contains a previous value of the signal line captured at a previous time determined by the clock signal, the storage device being coupled to the termination circuit, the termination circuit terminating the signal line to either of a first and a second voltage potential during a current clock cycle of the clock signal according to the previous value of the signal line.

31. A method of sending and receiving data represented using a high and a low value in a computer system with a clock signal having a first clock cycle and a second clock cycle subsequent to the first clock cycle, comprising the steps of:

driving a first data value on a signal line during the first clock cycle;

terminating the signal line to an initial voltage potential representing of either of the high and the low value during the first clock cycle;

sampling at a sampling time a first sampled value equal to the first data value, the sampling time determined by the clock signal;

driving a second data value on the signal line during the second clock;

terminating the signal line to a first voltage potential during the second clock cycle if the first sampled value is the high value; and terminating the signal line to a second voltage potential during the second clock cycle if the first sampled value is the low value.

32. The method of claim 31, before the step of sampling, further comprising:

comparing a signal line voltage on the signal line to a bias voltage selected using the initial termination value; and indicating that the first data value corresponds to either of the high and the low value.

33. A method of driving and terminating a signal line in a computer system having a plurality of bus agents including a first agent with a first agent identification value and a second agent with a second agent identification value, comprising the steps of:

a) determining a temporary bus master identification value for one of the plurality of bus agents which will next drive the bus;

b) if the temporary bus master identification value indicates the first agent identification value then
b.1) driving the signal line with the first bus agent;
b.2) terminating the signal line with only the second bus agent;
and c) if the temporary bus master identification value indicates the second agent identification value then c.1) driving the signal line with the second bus agent;

c.2) terminating the signal line with only the first bus agent.

34. The method of claim 33 wherein step b.2) further comprises using a previous value of the signal line sampled at a time determined by the clock signal in a previous clock cycle to terminate the signal line during a current clock cycle to either of a first and a second voltage potential.

35. A computer system including clock signal distribution means distributing a clock signal with a clock frequency and bus means including a first means for signal communication, comprising:

driving means coupled to the bus means for driving a first signal level indicating a first logic value during a first clock cycle of the clock signal and a second signal level indicating a second logic value during a second clock cycle of the clock signal on the first means for signal communication;

terminating means including storage means coupled to receive a periodic signal with the clock frequency and coupled to sample the first and the second logic values on the first means for signal distribution at a time determined by the periodic signal, the storage means containing the first logic value, the terminating means terminating the first means for signal distribution during the second clock cycle according to the first logic value.

36. An integrated circuit comprising:

an input node;

a delay element having an input coupled to receive a first input value of the input node, the delay element having an output providing a logic value representative of the first input value delayed a first period, the first period being determined by a clock signal;

a termination device selectably coupling the input node to a voltage potential dependent on the state of the logic value.

* * * * *